United States Patent
Kroeger et al.

(10) Patent No.: US 6,671,340 B1
(45) Date of Patent: Dec. 30, 2003

(54) METHOD AND APPARATUS FOR REDUCTION OF INTERFERENCE IN FM IN-BAND ON-CHANNEL DIGITAL AUDIO BROADCASTING RECEIVERS

(75) Inventors: Brian William Kroeger, Sykesville, MD (US); Jeffrey S. Baird, Columbia, MD (US)

(73) Assignee: iBiquity Digital Corporation, Columbia, MD (US)

( * ) Notice: Subject to any disclaimer, the term of this patent is extended or adjusted under 35 U.S.C. 154(b) by 776 days.

(21) Appl. No.: 09/595,369

(22) Filed: Jun. 15, 2000

(51) Int. Cl.[7] ................................................. H04B 1/10

(52) U.S. Cl. ...................... 375/350; 375/285; 375/346; 370/487; 455/296

(58) Field of Search ................................ 375/260, 262, 375/267, 285, 316, 340, 341, 346, 347, 350; 370/206, 208, 343, 487, 529; 455/67, 296, 303, 304, 305, 306; 714/795, 796

(56) References Cited

U.S. PATENT DOCUMENTS

| | | | |
|---|---|---|---|
| 5,191,576 A | 3/1993 | Pommier et al. | |
| 5,228,025 A | 7/1993 | Le Floch et al. | |
| 5,263,191 A | 11/1993 | Dickerson | |
| 5,274,629 A | 12/1993 | Helard et al. | |
| 5,278,826 A | 1/1994 | Murphy et al. | |
| 5,278,844 A | 1/1994 | Murphy et al. | |
| 5,278,871 A | * 1/1994 | Rasky et al. | ................. 375/343 |
| 5,315,583 A | 5/1994 | Murphy et al. | |
| 5,339,456 A | 8/1994 | Dickerson | |
| 5,355,533 A | 10/1994 | Dickerson | |
| 5,428,834 A | 6/1995 | Dickerson | |
| 5,465,396 A | 11/1995 | Hunsinger et al. | |
| 5,903,598 A | 5/1999 | Hunsinger et al. | |
| 5,949,796 A | 9/1999 | Kumar | |
| 5,949,813 A | 9/1999 | Hunsinger et al. | |
| 5,966,401 A | 10/1999 | Kumar | |
| 6,005,894 A | 12/1999 | Kumar | |
| 6,061,336 A | * 5/2000 | Baker | .......................... 370/320 |
| 6,108,810 A | * 8/2000 | Kroeger et al. | .............. 714/790 |
| 6,178,317 B1 | * 1/2001 | Kroeger et al. | .............. 455/296 |
| 6,246,698 B1 | * 6/2001 | Kumar | ......................... 370/487 |
| 6,259,893 B1 | * 7/2001 | Kroeger et al. | ................ 455/61 |
| 6,298,051 B1 | * 10/2001 | Odenwalder et al. | ........ 370/342 |
| 6,317,470 B1 | * 11/2001 | Kroeger et al. | .............. 375/340 |

FOREIGN PATENT DOCUMENTS

| | | |
|---|---|---|
| EP | 0952696 A2 | 10/1999 |
| WO | WO 00/27040 | 5/2000 |

OTHER PUBLICATIONS

M. Alard et al., "Principles of modulation and channel coding for digital broadcasting for mobile receivers", *EBU Review—Technical*, Aug. 1987, pp. 168–190, No. 224.

A. J. Vigil, "Wireless data transmission through in–band on–channel digital audio broadcasting", *SPIE*, Oct. 23, 1995, pp. 105–114, vol. 2601.

B. W. Kroeger et al., "Improved IBOC DAB Technology for AM and FM Broadcasting", Oct. 1996, pp. 1–10.

(List continued on next page.)

*Primary Examiner*—Chieh M. Fan
(74) *Attorney, Agent, or Firm*—Robert P. Lenart, Esq.; Pietragallo, Bosick & Gordon

(57) ABSTRACT

This invention provides a method for reducing radio frequency interference in an FM in-band on-channel digital audio broadcasting receiver. The method comprises the steps of receiving a composite signal including a signal of interest and an interfering signal, demodulating the composite signal to produce a first demodulated signal, computing a first binary soft decision from the first demodulated signal, processing the composite signal to produce a processed signal, demodulating the processed signal to produce a second demodulated signal, computing a second binary soft decisions from the second demodulated signal, and combining the first and second binary soft decisions to produce an output signal. Radio receivers that utilize the above method are also included.

29 Claims, 5 Drawing Sheets

OTHER PUBLICATIONS

B. W. Kroeger et al., "Robust IBOC DAB AM and FM Technology for Digital Audio Broadcasting", 51$^{st}$ Annual Broadcast Engineering Conference, Apr. 9, 1997.

B. W. Kroeger et al., "Robut Modem and Coding Techniques for FM Hybrid IBOC DAB", *IEEE Transactions on Broadcasting*, Dec. 1997, pp. 412–420, vol. 43, No. 4.

B. W. Kroeger et al., "Compatibility of FM Hybrid In–Band On–Channel (IBOC) System for Digital Audio Broadcasting", *IEEE Transactions on Broadcasting*, Dec. 1997, pp. 421–430, vol. 43, No. 4.

R. L. Cupo et al., "An OFDM All Digital In–Band–On–Channel (IBOC) AM and FM Radio Solution Using the PAC Encoder", *IEEE Transactions on Broadcasting*, Mar. 1998, pp. 22–27, vol. 44, No. 1.

H. C. Papadopoulos et al., "Simultaneous Broadcasting of Analog FM and Digital Audio Signals by Means of Adaptive Precanceling Techniques", *IEEE Transactions on Communications*, Sep. 1998, pp. 1233–1242, vol. 46, No. 9.

\* cited by examiner

METHOD AND APPARATUS FOR REDUCTION OF INTERFERENCE IN FM IN-BAND ON-CHANNEL DIGITAL AUDIO BROADCASTING RECEIVERS

BACKGROUND OF THE INVENTION

This invention relates to methods for reducing radio frequency interference and, more particularly, to signal processing techniques for use in Digital Audio Broadcasting (DAB) receivers and receivers that utilize such techniques.

Digital Audio Broadcasting is a medium for providing digital-quality audio, superior to existing analog broadcasting formats. Both AM and FM DAB signals can be transmitted in a hybrid format where the digitally modulated signal coexists with the currently broadcast analog AM or FM signal, or in an all-digital format without an analog signal. In-band-on-channel (IBOC) DAB systems require no new spectral allocations because each DAB signal is simultaneously transmitted within the spectral mask of an existing AM or FM channel allocation. IBOC systems promote economy of spectrum while enabling broadcasters to supply digital quality audio to their present base of listeners. Several IBOC DAB approaches have been suggested.

FM DAB systems have been the subject of several United States patent including U.S. Pat. Nos. 5,949,796; 5,465,396; 5,315,583; 5,278,844 and 5,278,826. More recently, a proposed FM IBOC DAB signal places orthogonal frequency division multiplexed (OFDM) sub-carriers in the region from about 129 kHz to about 199 kHz away from the FM center frequency, both above and below the spectrum occupied by an analog modulated host FM carrier. Some IBOC options (e.g., All-Digital option) permit subcarriers starting as close as 100 kHz away from the center frequency.

The digital portion of the DAB signal is subject to interference, for example, by first-adjacent FM signals or by host signals in Hybrid IBOC DAB systems. Signal processing techniques are required to separate out the signals of interest in the presence of the interferers.

One FM extraction technique called COLT (COntinuous Look Through) can be used to extract a narrowband signal from beneath a wideband FM signal. This technique is described in U.S. Pat. Nos. 5,263,191; 5,428,834; and 5,355, 533. The method described in those patents uses, in effect, a notch filter that tracks and suppresses the FM instantaneous frequency of an interfering signal.

U.S. patent application Ser. No. 09/192,555, assigned to the same assignee as the present invention, discloses an interference reduction technique that is particularly directed to reduction of interference from first adjacent channels of an FM broadcast band. Reduction of first adjacent channel interferers is hereafter referred to as first adjacent cancellation (FAC). FAC can be switched on or off as needed depending upon the particular signal environment. One method of switching on/off the FAC is to blend to and from the non-FAC processed signal. U.S. patent application Ser. No. 09/192,555 discloses a blending method for reducing FM interference in an in-band on-channel digital audio broadcasting receiver.

The FAC blend method of U.S. patent application Ser. No. 09/192,555 serves the purpose of selecting whether or not FAC is to be used depending upon the relative interference level. However, in some cases the corruption on the subcarrier frequencies may not be uniform and can be differently distributed for FM interference with FAC versus without FAC processing.

The is a need for a signal extraction technique that is effective for in-band on-channel digital audio broadcast signals where the corruption on the subcarrier frequencies may not be uniform and can be differently distributed for FM interference with FAC versus without FAC processing.

SUMMARY OF THE INVENTION

This invention provides a method for reducing interference in receivers used to receive an FM in-band on-channel digital audio broadcasting signal. The method comprises the steps of receiving a composite signal including a signal of interest and an interfering signal, demodulating the composite signal to produce a first demodulated signal, computing a first binary soft decision from the first demodulated signal, processing the composite signal to produce a processed signal, demodulating the processed signal to produce a second demodulated signal, computing a second binary soft decision from the second demodulated signal, and combining the first and second binary soft decisions to produce an output signal. In addition, the invention includes radio receivers that utilize the above method.

In the preferred embodiment, the signal of interest is a signal comprising a plurality of orthogonally frequency division multiplexed sub-carriers modulated by a digital representation of broadcast program material or other data, such as would be found in a digital audio broadcasting system. The present invention provides an improvement in the operation of a First Adjacent Canceller (FAC) technique intended for use in an FM In-Band On-Channel (IBOC) Digital Audio Broadcast (DAB) system where first-adjacent FM signals act as interferers to the digital portion of the DAB signal. The FAC cancels and/or notch filters the instantaneous frequency of an interfering FM signal to suppress the effects of interference from an FM broadcast signal. This permits blending of the FAC signal without adding the soft symbol information uniformly across the subcarriers.

DESCRIPTION OF THE PREFERRED EMBODIMENTS

Figure 1:
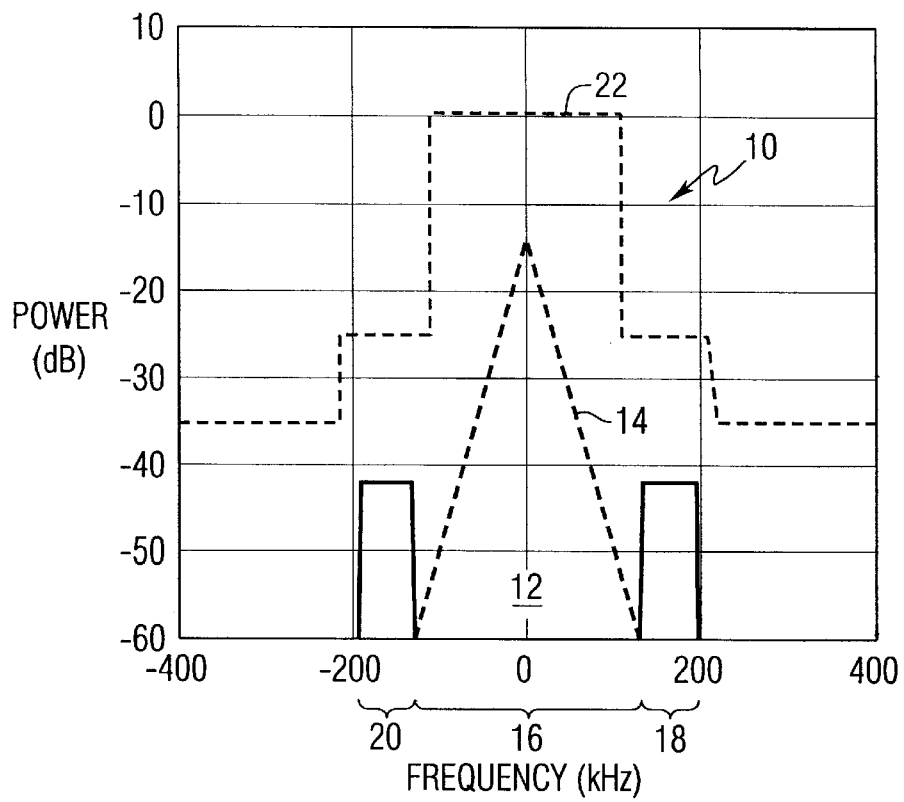
FIG. 1 is a diagram showing power spectral densities of an FM In-Band On-Channel Digital Audio Broadcast signal.

Referring to the drawings, FIG. 1 is a schematic representation of the frequency allocations (spectral placement)

and relative power spectral density of the signal components for a hybrid FM IBOC DAB signal 10. The hybrid format includes the conventional FM stereo analog signal 12 having a power spectral density represented by the triangular shape 14 positioned in a central portion 16, or central frequency band, of the channel. The Power Spectral Density (PSD) of a typical analog FM broadcast signal is nearly triangular with a slope of about −0.35 dB/kHz from the center frequency. A plurality of digitally modulated evenly spaced sub-carriers are positioned on either side of the analog FM signal, in an upper sideband 18 and a lower sideband 20, and are transmitted concurrently with the analog FM signal. All of the carriers are transmitted at a power level that falls within the United States Federal Communications Commission channel mask 22.

In one example of a hybrid FM IBOC modulation format, 95 evenly spaced orthogonal frequency division multiplexed (OFDM) digitally modulated sub-carriers are placed on each side of the host analog FM signal occupying the spectrum from about 129 kHz through about 198 kHz away from the host FM center frequency as illustrated by the upper sideband 18 and the lower sideband 20 in FIG. 1. In the hybrid system the total DAB power in the OFDM digitally modulated sub-carriers in each sideband is set to about −25 dB relative to its host analog FM power.

Figure 2:
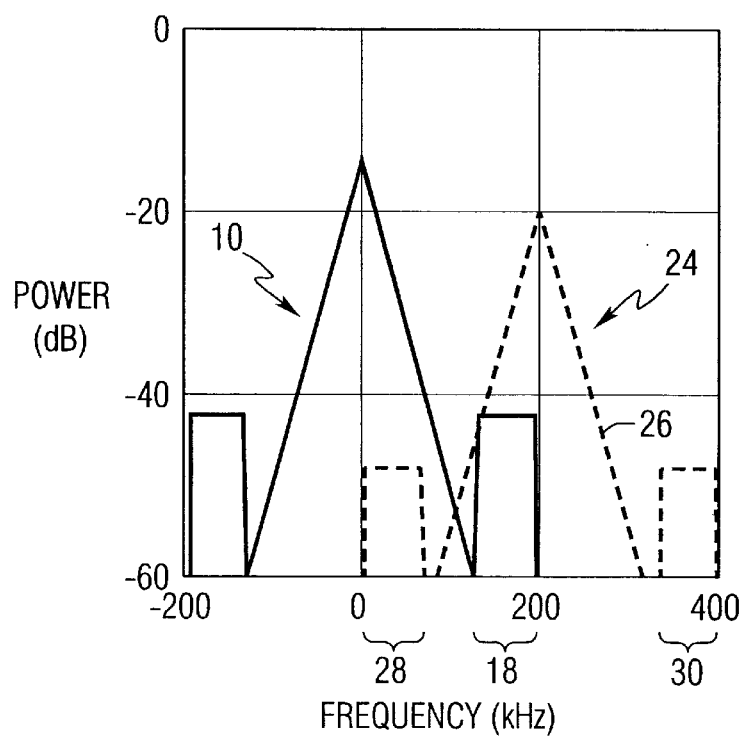
FIG. 2 is a diagram showing the power spectral densities of two FM In-Band On-Channel Digital Audio Broadcast signals in adjacent channels.

Signals from an adjacent FM channel (i.e. the first adjacent FM signals), if present, would be centered at a spacing of 200 kHz from the center of the channel of interest. FIG. 2 shows a spectral plot of a hybrid DAB signal 10 with an upper first adjacent interferer 24 having an analog modulated signal 26 and a plurality of digitally modulated sub-carriers in sidebands 28 and 30, that are at a level of about −6 dB relative to the signal if interest (the digitally modulated sub-carriers of signal 10). The figure shows that the DAB upper sideband 18 is corrupted by the analog modulated signal in the first adjacent interferer. The present invention provides a first adjacent canceller (FAC) that is able to suppress the effects of the interference in this situation. It has been demonstrated that the FAC is able to deal with first adjacent interferers on both upper and lower DAB sidebands, and successfully recover the DAB signal buried beneath them. The DAB signal is extracted from below the interfering FM carrier, although the extraction process distorts the DAB signal. It is assumed that the DAB signal is small relative to the interfering first adjacent analog FM signal such that FM tracking and cancellation can be effective.

Figure 3:
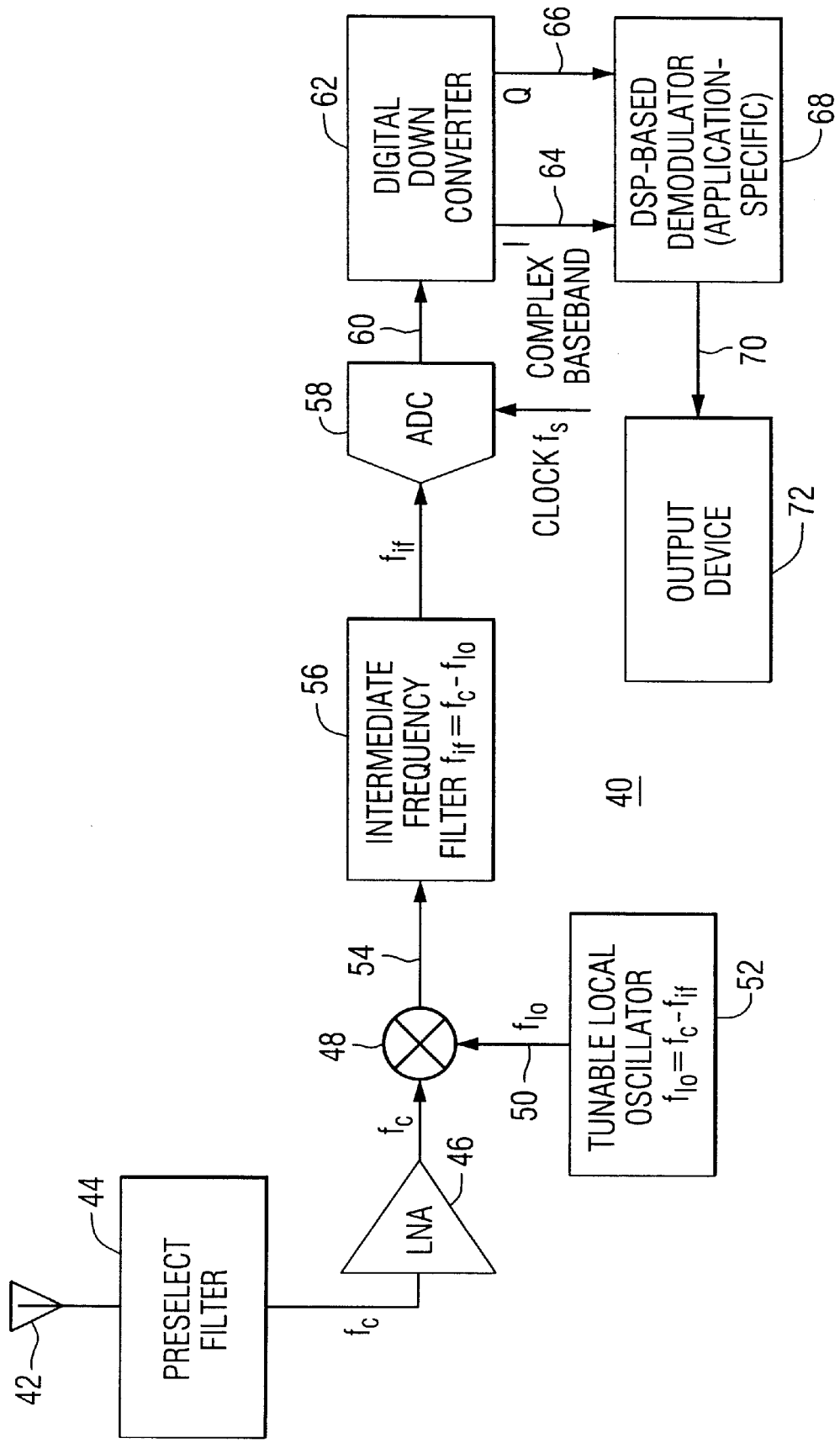
FIG. 3 is a functional block diagram of a receiver for use in a digital audio broadcasting system that can receive signals formatted in accordance with this invention.

FIG. 3 is a block diagram of a radio receiver 40 capable of performing the signal processing in accordance with this invention. The DAB signal is received on antenna 42. A bandpass preselect filter 44 passes the frequency band of interest, including the desired signal at frequency $f_c$, but rejects the image signal at $f_c - 2f_{if}$ (for a low side lobe injection local oscillator). Low noise amplifier 46 amplifies the signal. The amplified signal is mixed in mixer 48 with a local oscillator signal $f_{lo}$ supplied on line 50 by a tunable local oscillator 52. This creates sum ($f_c + f_{lo}$) and difference ($f_c - f_{lo}$) signals on line 54. Intermediate frequency filter 56 passes the intermediate frequency signal $f_{if}$ and attenuates frequencies outside of the bandwidth of the modulated signal of interest. An analog-to-digital converter 58 operates using a clock signal $f_s$ to produce digital samples on line 60 at a rate $f_s$. Digital down converter 62 frequency shifts, filters and decimates the signal to produce lower sample rate in-phase and quadrature signals on lines 64 and 66. A digital signal processor based demodulator 68 then provides additional signal processing to produce an output signal on line 70 for output device 72.

In the absence of fading the composite analog FM plus DAB signals can be modeled as:

$$s(t) = a \cdot e^{j\theta(t)} + d(t)$$

where a is the amplitude and $\theta(t)$ is the instantaneous phase of the of the FM signal, and d(t) is the DAB signal. Without loss of generality, we can assume that the average power of d(t) is one. Furthermore, we assume that a>>1 so that the FM capture effect is invoked. Notice that the signal amplitude is assumed to be constant since no fading of the signal is assumed in this part of the analysis. Also notice that this is the ideal case without noise. If this signal is processed using the techniques shown in U.S. Pat. Nos. 5,263,191; 5,428,834; and 5,355,533, then the output can be approximated by:

$$\text{COLT\_OUT}(t) \approx d(t) + d^*(t) \cdot e^{j \cdot 2\theta(t)}$$

The first term of the COLT output is the desired term while the second term is interference. Although the interference term has the same power as the first term, its spectrum is convolved with the square of the FM signal that has twice the FM modulation bandwidth.

If the bandwidth of the DAB signal equals the bandwidth of the interfering FM signal, and if the DAB signal is centered on the FM signal, the resulting signal to interference ratio using the prior art COLT technique is reduced to a few dB at most. Another large source of degradation is multipath fading. The fading results in amplitude modulation of the instantaneous FM carrier. Selective fading can result in an amplitude modulation bandwidth on the order of the FM baseband bandwidth (i.e. 53 kHz), while the bandwidth due to dynamic flat fading is limited to about 13 Hz at maximum highway speeds in an automobile receiver. Since the extraction process of U.S. Pat. Nos. 5,263,191; 5,428,834; and 5,355,533 uses the input signal directly to control the center frequency of the notch, the amplitude modulation on the input signal due to fading will affect the performance.

In the presence of fading the composite analog FM plus digitally modulated sub-carriers signals can be modeled as:

$$s(t) = [a + f(t)] \cdot e^{j\theta(t)} + d(t),$$

where f(t) is a dynamic fading term that is due to amplitude modulation of the FM carrier as it travels across the selectively faded deviation bandwidth. This amplitude modulation has a bandwidth on the order of the FM baseband bandwidth (i.e. 53 kHz). The slow fading component due to Raleigh fading is limited to about 13 Hz at highway speeds at a carrier frequency in the 100 MHz range. This slow fading component is omitted from this model since it is assumed to be nearly constant over the analysis window. In the presence of selective fading, the additional interference components become significant.

The filtering technique of U.S. Pat. Nos. 5,263,191; 5,428,834; and 5,355,533 assumed that the input signal itself is a good approximation of the FM signal, since the ratio of the analog FM power to the DAB power is high. However, where the input signal is subject to fading and is not a good approximation of the FM signal, the processing steps can create an image that cannot be removed in subsequent stages.

Figure 4:
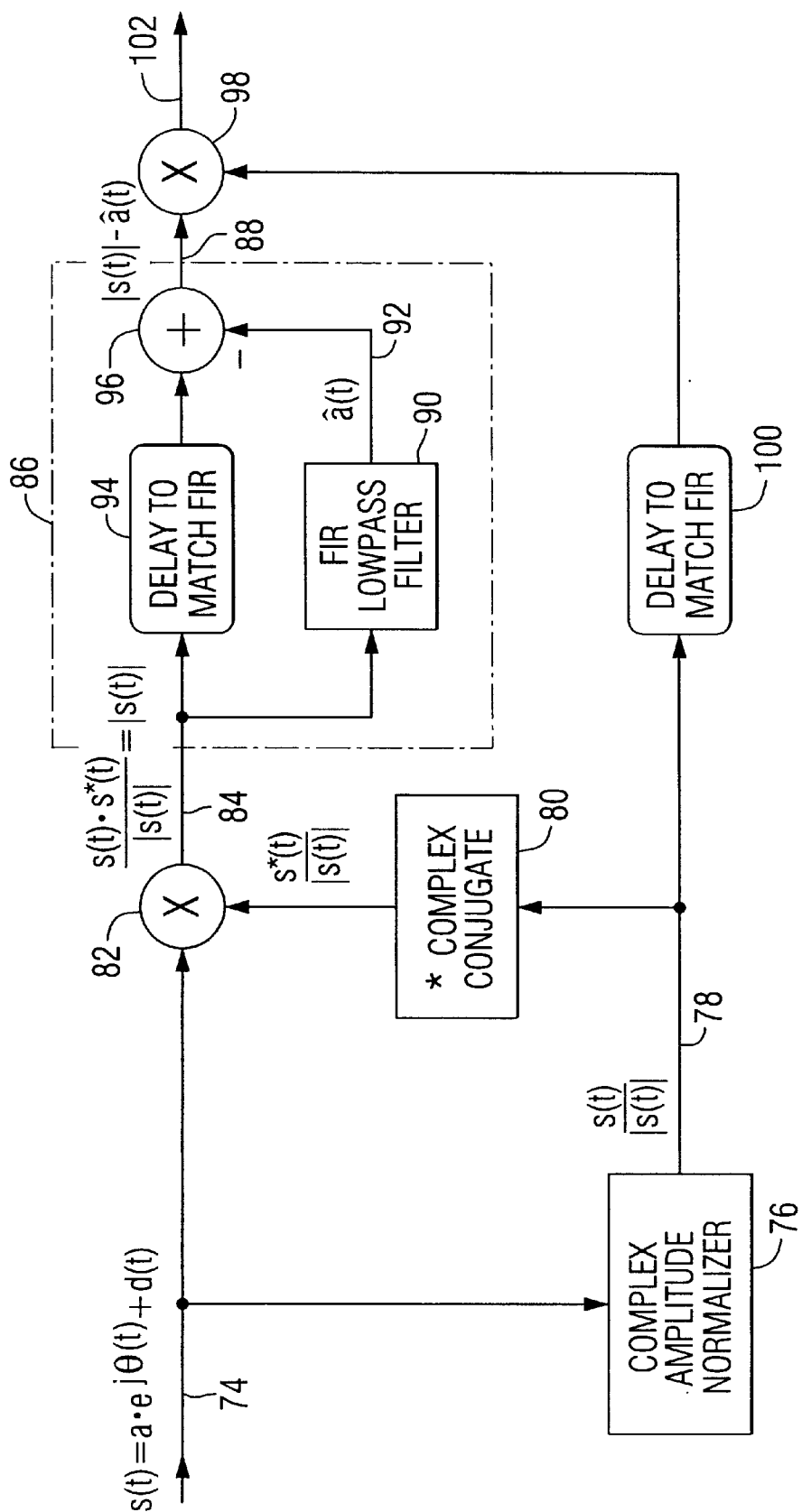
FIG. 4 is a block diagram that illustrates the signal processing method of U.S. patent application Ser. No. 09/192,555.

The filtering method of commonly owned U.S. patent application Ser. No. 09/438,148 addresses this problem using a normalized signal extraction process. A first multiplication of a signal shifts the instantaneous FM frequency to zero, while a second multiplication should perform the inverse of the first multiplication. Ideally, if the first and second signals are complex conjugates, and if the product of their amplitudes remains a fixed constant value, then the signal should be perfectly restored in phase and amplitude (minus the filtered out FM carrier). Unfortunately, dynamic fading and selective fading result in amplitude variations with the fading rate and the baseband signal bandwidth. The additional step to normalize the amplitude of the reference eliminates the generation of some of the undesirable interference associated with the original COLT technique. This normalized extraction process is shown in FIG. 4.

The composite signal:

$$s(t) = a \cdot e^{j\theta(t)} + d(t),$$

is received on line 74. Block 76 illustrates that the input is normalized by dividing by its absolute value to produce a normalized signal on line 78. In the presence of fading the composite analog FM plus DAB signals after normalization can be approximately modeled as:

$$\frac{s(t)}{|s(t)|} \cong e^{j\theta(t)} + \frac{d(t)}{[a+f(t)]},$$

where it is assumed that the FM analog signal is much larger than the digital DAB signal. The complex conjugate of the normalized signal is produced as illustrated by block 80, and the composite signal is multiplied by its normalized complex conjugate, as illustrated by multiplier 82, to yield the intermediate signal:

$$s(t) \cdot \frac{s^*(t)}{|s^*(t)|} = \{[a+f(t)] \cdot e^{j\theta(t)} + d(t)\} \cdot \left\{ e^{-j\theta(t)} + \frac{d^*(t)}{[a+f(t)]} \right\},$$

on line 84. A dc notch operation, illustrated by block 86, removes the constant term a to yield:

$$s(t) \cdot \frac{s^*(t)}{|s^*(t)|} - a = f(t) + d^*(t) \cdot e^{j\theta(t)} + d(t) \cdot e^{-j\theta(t)} + \frac{|d(t)|^2}{[a+f(t)]},$$

on line 88. A low pass finite impulse response filter 90 produces an estimate of the constant term on line 92. The signal on line 84 is delayed as illustrated by block 94 to match the filter delay and the output of the filter is subtracted from the delayed signal as shown by adder 96 to produce the intermediate signal on line 88. It should be noted that the DAB signal in the vicinity of the notch is also suppressed and the notch filtering has some effect on the integrity of the DAB signal. Lastly this intermediate signal is multiplied in multiplier 98 by the normalized original composite signal, which has been delayed as shown by block 100, to yield the output signal on line 102:

$$\frac{s(t)}{|s(t)|} \cdot \left\{ s(t) \cdot \frac{s^*(t)}{|s^*(t)|} - a \right\} = d(t) + d^*(t) \cdot e^{j2\theta(t)} + f(t) \cdot e^{j\theta(t)} + \frac{f(t) \cdot d(t)}{[a+f(t)]} + \frac{d^2(t) \cdot e^{-j\theta(t)}}{[a+f(t)]} + 2 \cdot \frac{|d(t)|^2 \cdot e^{-j\theta(t)}}{[a+f(t)]} + \frac{|d(t)|^2 \cdot d(t)}{[a+f(t)]^2}$$

Assuming that the FM signal is much larger than the DAB signal, which is the usual case, then the output can be approximated by:

$$\frac{s(t)}{|s(t)|} \cdot \left\{ s(t) \cdot \frac{s^*(t)}{|s^*(t)|} - a \right\} \cong d(t) + d^*(t) \cdot e^{j2\theta(t)} + f(t) \cdot \left\{ e^{j\theta(t)} + \frac{d(t)}{[a+f(t)]} \right\}.$$

The equation above shows that if the selective fading-induced amplitude modulation term f(t)=0, then the original COLT method result is achieved. However, in the presence of selective fading, the additional interference terms can be compared to those of the COLT technique under selective fading conditions. Specifically if:

$$e^{j\theta(t)} + \frac{d(t)}{[a+f(t)]} < \frac{1}{a^2} \left\{ \begin{array}{l} [4 \cdot a + 2 \cdot f(t)] \cdot d(t) + [a+f(t)] \cdot [2a+f(t)] \cdot \\ e^{j\theta(t)} + [2 \cdot a + f(t)] \cdot e^{j2\theta(t)} \cdot d^*(t) \end{array} \right\}$$

then the self-induced noise using the method of this invention is lower. The above inequality can be approximated by further elimination of less significant terms that are much less than one to yield:

$$e^{j\theta(t)} < 2 \cdot e^{j\theta(t)}$$

This shows a potential 6 dB improvement in noise reduction due to selective fading using the normalization technique.

The invention of U.S. patent application Ser. No. 09/192,555 reduces the adverse effects of the interfering signal in the output by increasing the magnitude or power spectral density of the signal of interest with respect to the interfering signal.

The FM cancellation process as described above is directly applicable to the FM IBOC DAB system whenever there is a first adjacent interfering FM signal. The first adjacent interfering FM signals can be processed and effectively canceled/notched out of the digital portion of the DAB signal with a reasonably small amount of distortion resulting to the DAB signal. The distortion will be fairly small if the following three conditions are met prior to initiating the FM cancellation process.

1) The only signals present that have significant power are the first adjacent FM and the digital portion of the DAB signal that is being interfered with (i.e. the upper or the lower digital side band of the DAB signal). This can be accomplished simply by mixing the FM interferer to 0 Hz and low-pass filtering the resulting signal or by band-pass filtering the resulting signal.

2) The digital signal is completely contained on either the upper or lower half the first adjacent FM signal. This is inherently done within the layout of an IBOC DAB system wherein the edge of the digital signal is placed almost out to +/−200 kHz, which is the center of the first adjacent FM signal. Therefore, the digital signal is contained on one half of the FM interferer. This is important since the undesirable distortion or image produced by this extraction process appears on the spectral side opposite the placement of the DAB signal relative to the FM signal.

3) The first adjacent FM signal is about 6 dB stronger in power than the digital signal. When the first adjacent power becomes to low, it is better not to perform FAC. This ensures that the FM signal is sufficiently large compared to the DAB signal such that the capture effect is invoked. In a multipath fading environment the FM signal will sometimes fall below the 6 dB power threshold and thus a switching off algorithm is recommended.

Within one proposed FM IBOC system, the three conditions will be present some of the time especially in the regions at the edge of an FM stations coverage. First adjacent FM cancellation will provide interference mitigation and thus extend the station's coverage.

Figure 5:
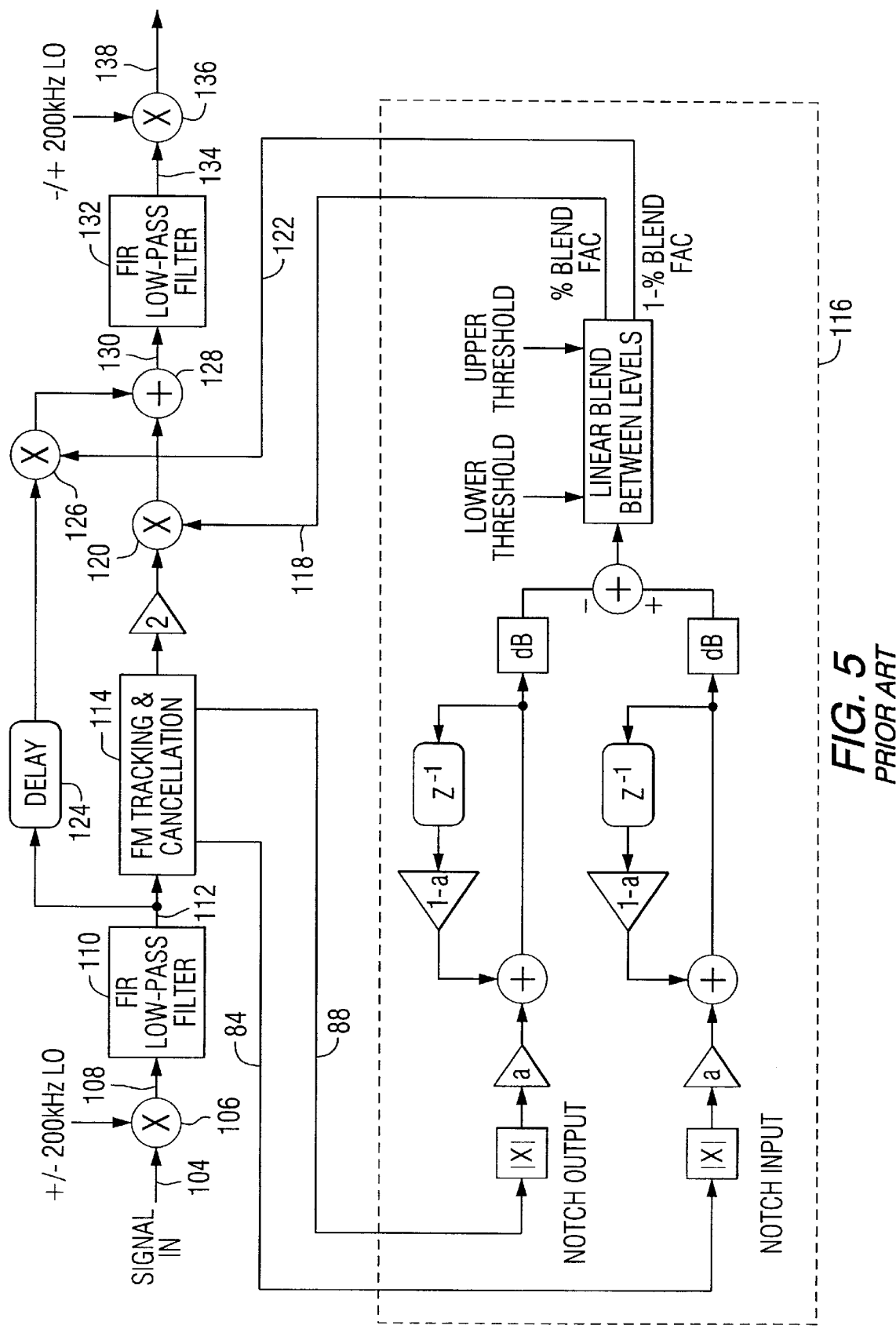
FIG. 5 is a block diagram that further illustrates the signal processing method of U.S. patent application Ser. No. 09/192,555.

One method of switching on/off the FAC is to smoothly blend to and from the non FAC processed signal. A measurement of the amount of power that is being notched can be made by taking the difference between the power that goes into the notch and the power that comes out of the notch. The two signals are smoothed using a simple lossy integrator before the difference is calculated. FIG. 5 is a block diagram which illustrates the FAC and blending functions of U.S. patent application Ser. No. 09/192,555, which can be performed on both upper and lower interfering first adjacent FM signals. The composite signal is input on line 104 and mixed with a local oscillator signal in mixer 106 to produce a baseband signal on line 108 where the first adjacent interferer is translated to dc. The signal is filtered by a finite impulse response low pass filter 110 to remove signals outside the bandwidth of the interfering FM signal. The resulting signal on line 112 is then subject to FM tracking and cancellation as illustrated in block 114. The cancellation is performed as illustrated in FIG. 4, with the signal before and after the notch filter being output on lines 84 and 88. In the blend control block 116, the notched power in dBs is compared to an upper and lower threshold that represents the range in which the blending will occur. The range is normalized so that the amount of notched power that resides within the unnormalized range can be represented by a straight percentage of the range. The control signal on line 118 is representative of a percentage number that is used to multiply the FAC processed signal in multiplier 120. A control signal on line 122 is representative of one minus the percentage number, and is used to multiply the non-FAC processed signal, which has been delayed as shown in block 124. The outputs of multipliers 120 and 126 are combined in summer 128 to produce a signal on line 130 that is filtered by a finite impulse response filter 132. The resulting filtered signal on line 134 is again mixed with a local oscillator signal in mixer 136 to produce an output signal on line 138. This output signal is then subject to further processing in accordance with know techniques to produce an audio output from the receiver.

Figure 6:
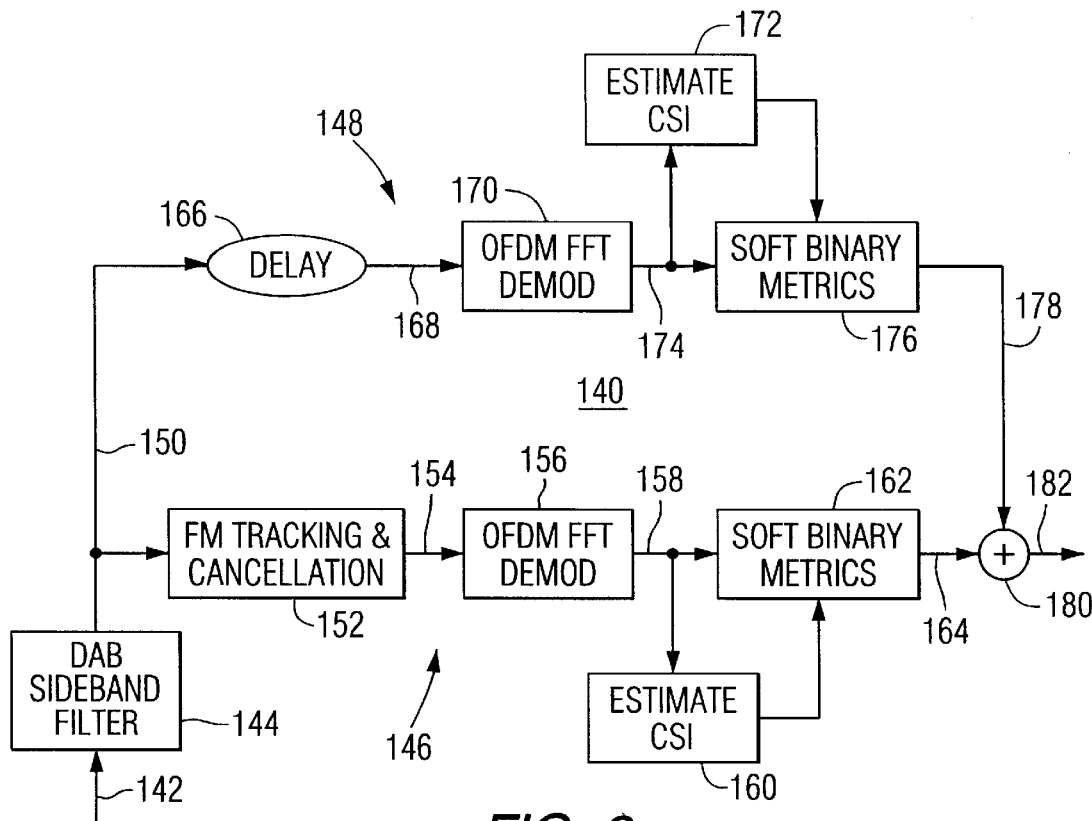
FIG. 6 is a block diagram that illustrates the operation of a first adjacent canceller (FAC) in accordance with this invention.

FIG. 6 is a functional block diagram 140 that illustrates the maximum ratio combining of FAC-processed and unprocessed soft symbol information in accordance with the present invention. The composite DAB signal is input on line 142 and filtered by a DAB sideband filter as shown in block 144. The filtered signal is then subjected to two demodulation schemes as illustrated by the blocks in paths 146 and 148. Path 146 subjects the filtered signal on line 150 to FAC processing. FM tracking and cancellation in block 152 is performed in the preferred embodiment as illustrated in FIG. 4. The resulting signal on line 154 is then demodulated as shown in block 156 to produce a demodulated signal on line 158. Block 160 shows that an estimate of the channel state information is made based on the demodulated signal. The CSI estimate is then used to determine the soft binary metrics for the demodulated signal as shown in block 164 to produce an FAC processed signal on line 164.

The filtered signal on line 150 is also delayed as shown in block 166. The delayed signal on line 168 is then demodulated as illustrated in block 170. Block 172 shows that an estimate of the channel state information is made based on the demodulated signal on line 174. The CSI estimate is then used to determine the soft binary metrics for the demodulated signal as shown in block 176 to produce an FAC processed signal on line 178. Maximum ratio combiner 180 then combines the signals on lines 164 and 178 to produce an output signal on line 182. This signal is then delivered to a deinterleaver and forward error correction decoder for further processing in the receiver.

In the present invention, soft-decision Viterbi decoding with weighting and maximum ratio combining (MRC) for coherently detected QPSK subcarrier symbols is employed to minimize losses over the channel. Maximum ratio combining (MRC) is a known method for combining multiple versions of the same signal corrupted by independent noise sources. Combining the multiple signals in proportion to the SNR of each of the inputs maximizes the signal-to-noise ratio (SNR) of the resulting signal. This method is applicable to combining both the FAC-processed and non-processed signal paths. The non-processed path may be corrupted by a first-adjacent FM interferer, while artifacts of the FAC process corrupt the FAC path. The interference or noise for each of these two paths is very different. If the soft symbols of each path are appropriately weighted with channel state information (CSI) before adding them together, then this is equivalent to MRC. The benefit is gained through coherent combining of the signal component (since the signal component is the same in the FAC and non-FAC paths), while the noise is combined non-coherently.

Figure 7:
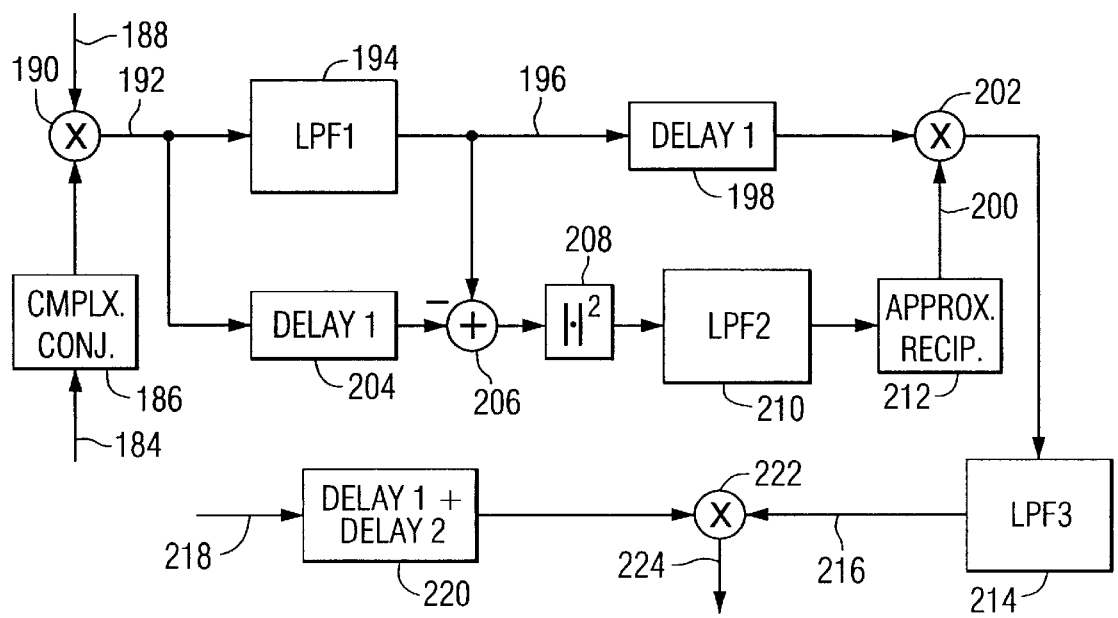
FIG. 7 is a block diagram that illustrates the process for determining channel state information, disclosed in U.S. patent application Ser. No. 09/438,148, that is used in the preferred embodiment of the invention.

Since the interference and signal levels vary over the subcarriers (frequency) and time due to selective fading, timely channel state information (CSI) is needed to adaptively adjust the weighting for the soft-symbols. The CSI estimation technique should be designed to accommodate a fading bandwidth of up to about 13 Hz for maximum vehicle speeds in the FM band around 100 MHz. A Doppler spread of several microseconds is typical, although larger spreads have been measured in some environments. A functional block diagram of the technique for estimating both the phase reference and the CSI from the reference subcarriers as shown in commonly assigned U.S. patent application Ser. No. 09/438,148, is illustrated in FIG. 7. This CSI weight combines amplitude weighting for maximum ratio combining along with a phase correction for channel phase errors.

The operation of the CSI recovery technique of FIG. 7 assumes acquisition and tracking of the frequency of the subcarriers, and the symbol timing of the OFDM symbols. The frequency and symbol timing acquisition techniques exploit properties of the cyclic prefix. The frequency and symbol tracking is accomplished through observation of the phase drift from symbol to symbol over time or frequency (across subcarriers).

After acquisition of both frequency and symbol timing, synchronization to the block sync pattern of the BPSK timing sequence is attempted by crosscorrelating the differentially detected BPSK sequence with the block sync pattern. The differential detection is performed over all subcarriers assuming that the location of the training subcarriers is initially unknown. A crosscorrelation of the known block sync pattern with the detected bits of each subcarrier is performed. A subcarrier correlation is declared when a match of all 11 bits of the block sync pattern is detected. Block synchronization (and subcarrier ambiguity resolution) is established when the number of subcarrier correlations meets or exceeds the threshold criteria (e.g. 4 subcarrier correlations spaced a multiple of 19 subcarriers apart).

After block sync is established the variable fields in the BPSK timing sequence can be decoded. The differentially detected bits of these variable fields are decided on a majority vote basis across the training subcarriers such that decoding is possible when some of these subcarriers or bits are corrupted. The 16 blocks within each modem frame are numbered sequentially from 0 to 15. Then the most significant bit of the block count field is always set to zero since the block count never exceeds 15. Modem frame synchronization is established with knowledge of the block count field.

The coherent detection of this signal requires a coherent phase reference. The decoded information from the BPSK timing sequence is used to remove the modulation from the training subcarriers leaving information about the local phase reference and noise. Referring to FIG. 7, the complex training symbols carried by the reference subcarriers are input on line 184 and the complex conjugate of the symbols is taken as shown in block 186. The complex conjugate is multiplied with a known training sequence on line 188 by multiplier 190. This removes the binary (+/−1) timing sequence modulation from the received training subcarriers by multiplying them by the synchronized and, decoded, and differentially-reencoded BPSK timing sequence. The resulting symbols on line 192 are processed by a finite impulse response (FIR) filter 194 to smooth the resulting symbols over time, yielding a complex conjugated estimate of the local phase and amplitude on line 196. This value is delayed by time delay 198 and multiplied by an estimate of the reciprocal of the noise variance on line 200 by multiplier 202. The noise variance is estimated by subtracting the smoothed estimate of the local phase and amplitude on line 196 from the input symbols (after appropriate time alignment provided by delay 204) at summation point 206, then squaring the result as shown by block 208, and filtering the complex noise samples as illustrated by block 210. The reciprocal is approximated (with divide-by-zero protection) as shown by block 212. This CSI weight is interpolated over the 18 subcarriers between pairs of adjacent training subcarriers as illustrated by block 214 to produce resulting local CSI weights on line 216. These CSI weights are then used to multiply the corresponding local data-bearing symbols received on line 218, after they have been appropriately delayed as shown in block 220. Multiplier 222 then produces the soft decision output on line 224.

The normalization process improves the performance under selective fading conditions. Besides being convenient for amplitude scaling, the normalization has a secondary effect of reducing amplitude variations of the DAB signal which are tracked by Channel State Information (CSI) estimators in subsequent stages of the DAB receiver. The improvement factor depends upon the type of CSI estimation process used and the bandwidth of these estimation filters. Furthermore the normalized signal uses a smaller dynamic range since the gain through the FAC process is unity instead of a². Matching the delay of the composite signal path to the notch filter delay is also important for good performance.

This can be used as a typical example for a modulation technique where the binary soft symbols are corrupted with independent noise (such as QPSK). If a higher order modulation such as QAM is used, then a pragmatic method of transforming the detected symbols into binary metrics must be implemented in order to enable the additive combining of the FAC-processed and unprocessed soft-decision information.

Soft-decision Viterbi decoding with weighting and maximum ratio combining (MRC) for coherently detected QPSK subcarrier symbols is employed to minimize losses over the channel. Since the interference and signal levels vary over the subcarriers (frequency) and time due to selective fading, timely channel state information (CSI) is needed to adaptively adjust the weighting for the soft-symbols. The CSI estimation technique should be designed to accommodate a fading bandwidth of up to about 13 Hz for maximum vehicle speeds in the FM band around 100 MHz. A Doppler spread of several microseconds is typical, although larger spreads have been measured in some environments. A functional block diagram of the technique for estimating both the phase reference and the CSI from the reference subcarriers is illustrated in FIG. 8. This CSI weight combines the amplitude weighting for maximum ratio combining (MRC) along with a phase correction for channel phase errors.

$$CSIweight = \frac{\hat{a}^*}{\sigma^2},$$

where â* is and estimate of the complex conjugate of the channel gain and $\sigma^2$ is an estimate of the variance of the noise The operation of the CSI recovery technique of FIG. 7 assumes acquisition and tracking of the frequency of the subcarriers, and the symbol timing of the OFDM symbols. The frequency and symbol timing acquisition techniques exploit properties of the cyclic prefix. The frequency and symbol tracking is accomplished through observation of the phase drift from symbol to symbol over time or frequency (across subcarriers).

After acquisition of both frequency and symbol timing, synchronization to the block sync pattern of the BPSK timing sequence is attempted by crosscorrelating the differentially detected BPSK sequence with the block sync pattern. The differential detection is performed over all subcarriers assuming that the location of the training subcarriers is initially unknown. A crosscorrelation of the known block sync pattern with the detected bits of each subcarrier is performed. A subcarrier correlation is declared when a match of all 11 bits of the block sync pattern is detected. Block synchronization (and subcarrier ambiguity resolution) is established when the number of subcarrier correlations meets or exceeds the threshold criteria (e.g. 4 subcarrier correlations spaced a multiple of 19 subcarriers apart).

After block sync is established the variable fields in the BPSK timing sequence can be decoded. The differentially detected bits of these variable fields are decided on a majority vote basis across the training subcarriers such that decoding is possible when some of these subcarriers or bits are corrupted. The 16 blocks within each modem frame are numbered sequentially from 0 to 15. Then the MSB of the block count field is always set to zero since the block count never exceeds 15. Modem frame synchronization is established with knowledge of the block count field.

This invention provides a near optimum method of combining the FAC and no-FAC soft symbol information to demodulate/detect and compute the binary soft decision from both the FAC and unprocessed signals, as shown in FIG. 6.

The present invention provides cancellation and/or notch filtering of an interfering FM signal's instantaneous frequency to suppress the effects of interference from FM Broadcast signals. The invention is particularly applicable to FM In-Band On-Channel (IBOC) Digital Audio Broadcast (DAB) systems where first-adjacent FM signals act as interferers to the digital portion of the DAB signal. This technique can also be used in a Hybrid IBOC FM DAB system to suppress the effects of interference from the host FM signal to the digital portion of the DAB signal.

While the invention has been described in terms of what is believed at present to be the preferred embodiment thereof, it will be appreciated by those skilled in the art that various modifications to the disclosed embodiments may be made without departing from the scope of the invention as set forth in the appended claims.

What is claimed is:

1. A method for reducing FM interference in an in-band on-channel digital audio broadcasting system, said method comprising the steps of:

receiving a composite signal including a signal of interest and an interfering signal;

demodulating the composite signal to produce a first demodulated signal;

computing a first binary soft decision from the first demodulated signal;

processing the composite signal to produce a processed signal;

demodulating the processed signal to produce a second demodulated signal;

computing a second binary soft decision from the second demodulated signal; and combining the first and second binary soft decisions to produce an output signal.

2. The method of claim 1, wherein the step of combining the first and second binary soft decisions to produce an output signal comprises the step of:

maximum ratio combining the first and second binary soft decisions.

3. The method of claim 1, wherein the step of processing the composite signal to produce a processed signal comprises the step of:

filtering the composite signal.

4. The method of claim 1, wherein the step of computing a first binary soft decision from the first demodulated signal comprises the steps of estimating channel state information for the first demodulated signal, and using the channel state information for the first demodulated signal to compute the first binary soft decision; and wherein the step of computing a second binary soft decision from the second demodulated signal comprises the steps of estimating channel state information for the second demodulated signal, and using the channel state information for the second demodulated signal to compute the second binary soft decision.

5. The method of claim 1, further comprising the step of:

delaying the composite signal prior to the step of demodulating the composite signal.

6. The method of claim 1, wherein the step of processing the composite signal to produce a processed signal comprises the steps of:

normalizing the composite signal to produce a normalized composite signal;

multiplying said composite signal by a complex conjugate of said normalized composite signal to produce a real signal;

filtering said real signal to produce a filtered signal; and multiplying said filtered signal by said normalized composite signal to produce said processed signal.

7. The method of claim 6, wherein the step of filtering said real signal to produce a filtered signal comprises the steps of:

producing a carrier amplitude estimate signal;

delaying said real signal to produce a delayed real signal; and subtracting said carrier amplitude estimate signal from said delayed real signal to produce said filtered signal.

8. The method of claim 6, further comprising the step of:

delaying said normalized composite signal prior to the step of multiplying said filtered signal by said normalized composite signal.

9. The method of claim 1, wherein said composite signal comprises:

a plurality of digitally modulated sub-carriers and an analog modulated carrier.

10. The method of claim 1, wherein said step of combining the first and second binary soft decisions to produce an output signal further comprises the step of:

blending first and second binary soft decisions to produce the output signal.

11. A receiver for receiving an FM interference in an in-band on-channel digital audio broadcasting signal, said receiver comprising:

means for receiving a composite signal including a signal of interest and an interfering signal;

means for demodulating the composite signal to produce a first demodulated signal;

means for computing a first binary soft decision from the first demodulated signal;

means for processing the composite signal to produce a processed signal;

means for demodulating the processed signal to produce a second demodulated signal;

means for computing a second binary soft decision from the second demodulated signal; and means for combining the first and second binary soft decisions to produce an output signal.

12. The receiver of claim 11, wherein the means for combining the first and second binary soft decisions to produce an output signal comprises:

means for maximum ratio combining the first and second binary soft decisions.

13. The receiver of claim 11, wherein the means for processing the composite signal to produce a processed signal comprises:

means for filtering the composite signal.

14. The receiver of claim 11, wherein the means for computing a first binary soft decision from the first demodulated signal comprises means for estimating channel state information for the first demodulated signal, and means for using the channel state information for the second demodulated signal to compute the first binary soft decision; and wherein the means for computing a second binary soft decision from the second demodulated signal comprises means for estimating channel state information for the second demodulated signal, and means for using the channel state information for the second demodulated signal to compute the second binary soft decision.

15. The receiver of claim 11, further comprising:

means for delaying the composite signal prior to demodulating the composite signal.

16. The receiver of claim 13, wherein the means for filtering the composite signal comprises:

means for normalizing the composite signal to produce a normalized composite signal;

means for multiplying said composite signal by a complex conjugate of said normalized composite signal to produce a real signal;

means for filtering said real signal to produce a filtered signal; and means for multiplying said filtered signal by said normalized composite signal to produce said processed signal.

17. The receiver of claim 16, wherein the means for filtering said real signal to produce a filtered signal comprises:

means for producing a carrier amplitude estimate signal;

means for delaying said real signal to produce a delayed real signal; and means for subtracting said carrier amplitude estimate signal from said delayed real signal to produce said filtered signal.

18. The receiver of claim 16, wherein the means for filtering the composite signal comprises:

means for delaying said normalized composite signal prior to the step of multiplying said filtered signal by said normalized composite signal.

19. The receiver of claim 16, wherein the means for normalizing the composite signal comprises:

means for dividing said composite signal by an absolute value of the composite signal.

20. The receiver of claim 11, wherein the means for combining the first and second binary soft decisions to produce an output signal further comprises:

means for blending first and second binary soft decisions to produce the output signal.

21. A receiver for receiving an FM interference in an in-band on-channel digital audio broadcasting signal, said receiver comprising:

an input for receiving a composite signal including a signal of interest and an interfering signal;

a first demodulator for demodulating the composite signal to produce a first demodulated signal;

a first processor for computing a first binary soft decision from the first demodulated signal;

a filter for processing the composite signal to produce a processed signal;

a second demodulator for demodulating the processed signal to produce a second demodulated signal;

a second processor for computing a second binary soft decision from the second demodulated signal; and a combiner for combining the first and second binary soft decisions to produce an output signal.

22. The receiver of claim 21, wherein the combiner combines the first and second binary soft decisions using maximum ratio combining.

23. The receiver of claim 21, wherein the first processor for computing a first binary soft decision from the first demodulated signal estimates channel state information for the first demodulated signal, and uses the channel state information for the first demodulation signal to compute the first binary soft decision; and wherein the second processor for computing a second binary soft decision from the second demodulated signal estimates channel state information for the second demodulated signal, and uses the channel state information for the second demodulated signal to compute the second binary soft decision.

24. The receiver of claim 21, further comprising:

a delay device for delaying the composite signal prior to demodulating the composite signal.

25. The receiver of claim 21, wherein the filter comprises:

a normalizer for normalizing the composite signal to produce a normalized composite signal;

a first multiplier for multiplying said composite signal by a complex conjugate of said normalized composite signal to produce a real signal;

a real signal filter for filtering said real signal to produce a filtered signal; and a second multiplier for multiplying said filtered signal by said normalized composite signal to produce said processed signal.

26. The receiver of claim 25, wherein the real signal filter comprises:

an estimator for producing a carrier amplitude estimate signal;

a delay device for delaying said real signal to produce a delayed real signal; and a combiner for subtracting said carrier amplitude estimate signal from said delayed real signal to produce said filtered signal.

27. The receiver of claim 25, wherein the filter for processing the composite signal comprises:

a delay device for delaying said normalized composite signal prior to multiplying said filtered signal by said normalized composite signal.

28. The receiver of claim 25, wherein the normalizer comprises:

a divider for dividing said composite signal by an absolute value of the composite signal.

29. The receiver of claim 21, wherein the combiner for combining the first and second binary soft decisions to produce an output signal further comprises:

is a blending means for blending first and second binary soft decisions to produce the output signal.

* * * * *

UNITED STATES PATENT AND TRADEMARK OFFICE
CERTIFICATE OF CORRECTION

PATENT NO. : 6,671,340 B1
DATED : December 30, 2003
INVENTOR(S) : Brian William Kroeger and Jeffrey S. Baird It is certified that error appears in the above-identified patent and that said Letters Patent is hereby corrected as shown below:

<u>Title page,</u>
Item [57], ABSTRACT,
Line Line 11, "decisions" should read -- decision --.

<u>Column 1,</u>
Line 26, "patent" should read -- patents --.

<u>Column 2,</u>
Line 1, "The" should read -- There --.

<u>Column 3,</u>
Line 32, "$2 \cdot \frac{|d(t)|^2 \cdot e^{-j\Theta(t)}}{[a + f(t)]}$" should read -- $2 \cdot \frac{|d(t)|^2 \cdot e^{j\Theta(t)}}{[a + f(t)]}$ --.

<u>Column 5,</u>
Line 62, "if" should read -- of --.

<u>Column 7,</u>
Line 37, "know" should read -- known --.
Line 54, "block 164" should read -- block 162 --.
Line 62, "FAC processed" should read -- unprocessed --.

<u>Column 10,</u>
Line 3, "FIG. 8" should read -- FIG. 7 --.
Line 10, "and" should read -- an --.
Line 12, "noise" should read -- noise. --.

<u>Column 12,</u>
Line 34, "second" should read -- first --.

UNITED STATES PATENT AND TRADEMARK OFFICE
CERTIFICATE OF CORRECTION

PATENT NO. : 6,671,340 B1
DATED : December 30, 2003
INVENTOR(S) : Brian William Kroeger and Jeffrey S. Baird It is certified that error appears in the above-identified patent and that said Letters Patent is hereby corrected as shown below:

Column 14,
Line 40, "is" should be deleted.

Signed and Sealed this

Nineteenth Day of October, 2004

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,671,340 B1 | Page 1 of 2 |
| APPLICATION NO. | : 09/595369 | |
| DATED | : December 30, 2003 | |
| INVENTOR(S) | : Brian William Kroeger and Jeffrey S. Baird | |

It is certified that error appears in the above-identified patent and that said Letters Patent is hereby corrected as shown below:

Title page,
Item [57], ABSTRACT,
Line Line 11, "decisions" should read -- decision --.

Column 1,
Line 26, "patent" should read -- patents --.

Column 2,
Line 1, "The" should read -- There --.

Column 3,
Line 32, "if" should read -- of --.

Column 5,
Line 62, "$2 \cdot \frac{|d(t)|^2 \cdot e^{-j\Theta(t)}}{[a + f(t)]}$" should read -- $2 \cdot \frac{|d(t)|^2 \cdot e^{j\Theta(t)}}{[a + f(t)]}$ --.

Column 7,
Line 37, "know" should read -- known --.
Line 54, "block 164" should read -- block 162 --.
Line 62, "FAC processed" should read -- unprocessed --.

Column 10,
Line 3, "FIG. 8" should read -- FIG. 7 --.
Line 10, "and" should read -- an --.
Line 12, "noise" should read -- noise. --.

Column 12,
Line 34, "second" should read -- first --.

UNITED STATES PATENT AND TRADEMARK OFFICE
CERTIFICATE OF CORRECTION

PATENT NO. : 6,671,340 B1
APPLICATION NO. : 09/595369
DATED : December 30, 2003
INVENTOR(S) : Brian William Kroeger and Jeffrey S. Baird It is certified that error appears in the above-identified patent and that said Letters Patent is hereby corrected as shown below:

Column 14,
Line 40, "is" should be deleted.

This certificate supersedes Certificate of Correction issued October 19, 2004.

Signed and Sealed this

Twenty-second Day of August, 2006

JON W. DUDAS
*Director of the United States Patent and Trademark Office*